United States Patent [19]

Levin

[11] 4,335,273
[45] Jun. 15, 1982

[54] ELECTRICALLY INSULATING SEAL ASSEMBLY

[75] Inventor: Harry P. Levin, N. Hollywood, Calif.

[73] Assignee: Electric Power Research Institute, Inc., Palo Alto, Calif.

[21] Appl. No.: 42,670

[22] Filed: May 25, 1979

[51] Int. Cl.³ .............................................. F16J 15/10
[52] U.S. Cl. ...................... 174/52 S; 277/3; 277/171
[58] Field of Search ............. 174/52 S, 17 CT; 277/3, 277/168, 170, 171

[56] References Cited

U.S. PATENT DOCUMENTS

| | | |
|---|---|---|
| 1,839,340 | 1/1932 | Pittlick . |
| 3,211,478 | 10/1965 | Batzer .......................... 277/170 X |
| 3,670,092 | 6/1972 | Updyke et al. .................... 174/52 S |
| 3,870,322 | 3/1975 | Marshall ........................ 277/171 X |
| 3,915,461 | 10/1975 | Gautier ......................... 277/171 X |
| 4,111,330 | 9/1978 | Jordan . |

Primary Examiner—Elliot A. Goldberg
Assistant Examiner—D. A. Tone
Attorney, Agent, or Firm—Nilsson, Robbins, Dalgarn, Berliner, Carson & Wurst

[57] ABSTRACT

A static junction seal assembly for electrically insulating a high potential between the interior and the exterior of a housing. The housing has first and second halves, having a first seal surface and a second seal surface, respectively. The seal surfaces are covered with a dielectric grease and are juxtaposed with a nonconductive gasket therebetween. The space between the seal surfaces increases from a central location to an edge location and the gasket adjacent the central location has a maximum thickness which decreases continuously from the central location to a gasket edge location when the gasket and seal surfaces are juxtaposed in an uncompressed state. The relative configuration of the first and second seal surfaces and the gasket are thus selected so that as the gasket is progressively compressed between the seal surfaces, a gasket bulge will initially form at the central location and thereafter move from the central location to the edge location. The movement of the gasket bulge displaces and expels the grease and any entrapped air along the seal surface to form a grease filled, bubble free, insulating seal. For sealing an access port through the housing, the port is provided with sides sloped inwardly toward the center of the port at a first angle. A plug having inwardly sloped sides at a second smaller angle is inserted in the port and is compressed thereby progressively forming a plug bulge which moves progressively upward expelling grease and all entrapped air.

15 Claims, 9 Drawing Figures

ELECTRICALLY INSULATING SEAL ASSEMBLY

BACKGROUND OF THE INVENTION

The present invention relates to electrically insulating static seals and in particular to a high voltage insulating seal with means to progressively expel air bubbles along the seal surfaces as the seal surfaces are compressed together.

In many apparatus such as the phase angle meter instrument disclosed in my copending application, Ser. No. 042,671 filed May 25, 1979, the interior of an enclosed housing is maintained at a potential substantially different than the potential exterior of the housing. It is therefore essential that the housing be electrically insulated to provide protection against damage and from electrical shock. A particularly serious problem arises if the housing has two or more parts which must be joined to form the housing enclosure or where enclosure access ports are required. Such junction must be adequately insulated to eliminate any conductive path between the inside and outside of the housing.

Previously, adequate electrical insulation has been achieved by disposing a rubber gasket between junction surfaces or by inserting a rubber plug in each access port. However, rubber breaks down where high voltages exist. This breakdown forms conductive carbon tracks along the interface of the gasket with the seal surface. In addition, it has been found that miniscule air bubbles, which exist along the seal surface, ionize and form conductive paths along the junction surfaces when high voltages are present.

Hence, the present electrically insulating seal assembly provides a configuration for the seal surfaces which captures and expels all air entrapments as the seal surfaces are compressed together and thus prevents formation of conductive pathways. The dielectric strength of the present seal is a function of the dielectric grease used and the length of the path along the gasket to seal surface interface from the interior to the exterior of the housing.

SUMMARY OF THE INVENTION

In accordance with one embodiment of the invention, a front housing portion is provided with a tongue-like protrusion about its periphery and a rear housing portion is provided with a corresponding mating groove about its periphery. The tongue-like protrusion has a taper at a first angle and the groove has a taper at a second angle where the first angle is smaller than the second angle. Hence, when the tongue is juxtaposed in the groove, the width of the space between the front and rear housing portions is smallest at the apex of the tongue and is largest at the edges of the seal surfaces remote from the apex. A gasket is also provided having a tapered thickness with its greatest thickness being at a center location adapted to be placed between the apex of the tongue and the bottom of the groove. The thickness of the gasket decreases outwardly from the center location to its outermost edges.

Prior to assembly, a layer of the dielectric grease is applied to the seal surfaces. The gasket is then applied over the tongue and both items are inserted into the groove. The first point of contact in the process of forming a seal takes place at the apex of he tongue. As the front and rear halves of the enclosure housing are compressed together, a bulge forms on the gasket adjacent to the apex of the tongue. As the gasket is progressively compressed the bulge travels outwardly from the apex of the tongue to the edge of the gasket thereby capturing air bubbles in the grease. In the final compressed state a pressure gradient exists along the gasket interface with the enclosure. This causes the grease and air to be expelled outwardly about the edges of the seal surfaces to finally form a completely grease filled, bubble free seal. The resultant seal has been found to have a dielectric strength equal to that of the grease itself. For example, it has been found that a dielectric strength of 72 kilovolts AC can be continuously maintained utilizing a dimethylsilicone gasket with fluorosilicone grease where the housing thickness is approximately 0.25 inches and the path length across the seal is approximately 2.00 inches.

The invention may also be utilized to form dielectric seals in access ports through the housing by providing the port with side walls sloped inwardly toward the center axis of the port at a first slope angle and providing a plug with side walls sloped inwardly toward the center axis of the plug at a second slope angle where the slope angle of the plug is less than the slope angle of the port. The plug is then covered with a dielectric grease and inserted into the port. In the non-compressed state, a wedge-shaped annular space will thus be formed which increases in width from the bottom to the top of the port. The compression of the plug into the port generates a bulge at the lowermost portion of the plug which progressively moves upward displacing the grease and expelling all air bubbles out from the top region of the opening as the compression force increases.

BRIEF DESCRIPTION OF THE DRAWINGS

A complete understanding of the present invention and of the above and other advantages thereof may be gained from a consideration of the following description of the preferred embodiments taken in conjunction with the accompanying drawings in which.

DETAILED DESCRIPTION

In my copending patent application for a PHASE ANGLE METER INSTRUMENT, Ser. No. 042,671, filed May 25, 1979 an enclosure assembly or housing was described having a front housing portion and a rear housing portion which were joined together with a gasket therebetween. The interior reference potential of the housing is substantially higher than zero volts, which is the normal potential external to the housing. Hence, it is necessary to provide insulation between the interior and the exterior of the housing to protect the operator and to prevent damage to the instrument.

It is well known that electrical flash-over through the atmosphere occurs as a result of the ionization of air molecules in a potential field. Thus, in order to provide an adequately insulated junction seal between the front and rear housing portions, all air entrapments along the surface of the gasket must be expelled.

Figure 1:
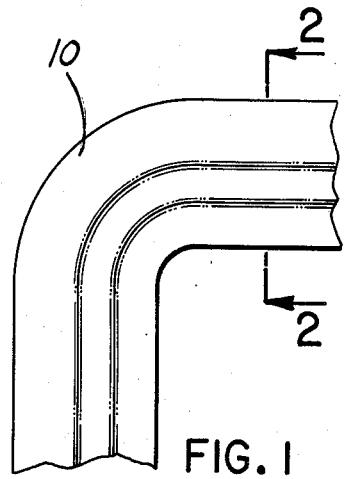
FIG. 1 is a top view of a portion of a U-shaped gasket in accordance with one embodiment of the present invention.
Figure 2:
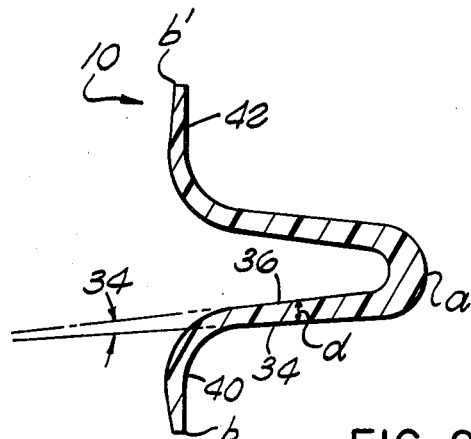
FIG. 2 is a cross sectional end view of the gasket of FIG. 1 through Section 2—2.

Referring to FIGS. 1, 2, 3 and 4A through 4C, a highly effective electrically insulative seal is illustrated for being formed between a front housing 16 and a rear housing 12 utilizing a gasket 10 and a dielectric grease 20. Referring specifically to FIGS. 1 and 2, a portion of a substantially square or rectangular gasket 10 which may be positioned about the periphery of the junction between the front housing portion 16 and the rear housing portion 12 has a generally U-shaped cross section with outwardly extending flanges 40 and 42 on either side of the U-shaped portion. The gasket 10 has a maximum thickness at a point, a, at the bottom of the U-shaped portion and a minimum thickness at the points b and b' at the edges of the outwardly extending flanges 40 and 42. The thickness d decreases in a generally continuous manner from point a to the points b and b'. Hence the front or top surface 36 of the gasket and the back or bottom surface 34 of the gasket converge toward one another in the direction of b and b' at a convergence angle 34. In the preferred embodiment, the convergence angle 34 is about one degree although a greater or smaller convergence angle is also possible depending on the flexibility and deformability of the material used for the gasket.

It will be appreciated that any cross sectional shape of the gasket may be used. Thus, in certain applications the gasket may have a generally level, or flat configuration with a relatively thick portion along one edge, or the middle and a relatively thin portion remote therefrom, or it may have a W-like configuration, with a relatively thick portion in the center of the W and a relatively thin portion at the two remote legs of the W. However, regardless of the specific cross sectional shape, it is essential that the gasket have a relatively thick portion and a relatively thin portion with a substantially continuous decreasing thickness between a relatively thick portion and a relatively thin portion. In the preferred embodiment, the cross section of the gasket has a generally U-shaped configuration.

Figure 3:
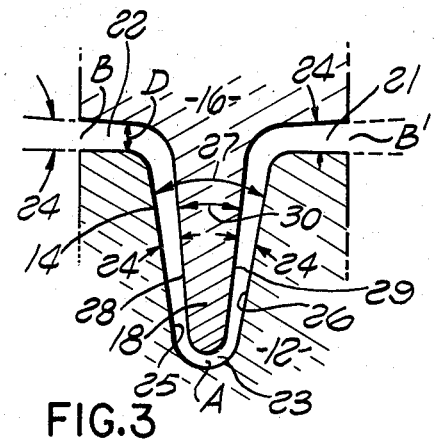
FIG. 3 is a cross sectional end view of a housing junction between first and second housing sections juxtaposed in a symmetrical orientation.

Referring now to FIG. 3, a cross section of the front housing 16 and the rear housing 12 are symmetrically juxtaposed in a non-compressed configuration with a cavity 23 therebetween into which the gasket 10 is to be positioned. The cross section of the cavity 23 is generally U-shaped also with outwardly extending upper portions 21 and 22. Thus, the rear housing 12 has a rear housing junction groove 14 into which a front housing junction tongue 18 extends. When the front housing tongue 18 is juxtaposed in the rear housing junction groove 14 in an aligned symmetrical orientation the width of the space D between the front housing 16 and the rear housing 12 is minimum at the bottom A of the rear housing junction groove 14 and is maximum (and equal) at outer edges, B and B', of the outwardly extending portions 22 and 21. Hence, while the thickness d of the gasket shown in FIG. 2 decreases from point a to points b and b', the clearance space D of the cavity 23 increases from point A to points B and B'.

In the specific embodiment shown, the seal surfaces 25 and 26 of the rear housing groove 14 are inwardly sloped towards the bottom of the groove with the opposing downwardly extending seal surfaces forming an angle 27. The seal surfaces 28 and 29 of the front housing junction tongue 18 are also inwardly sloped to form an angle 30 relative to each other. Thus, when the front housing junction tongue 18 is juxtaposed in the rear housing junction groove 14 in symmetrical alignment, the seal surfaces of the front housing junction tongue 18 and the opposed seal surfaces of the rear housing junction groove 14 form an angle 24 opening toward the points B' and B.

Figure 4A:
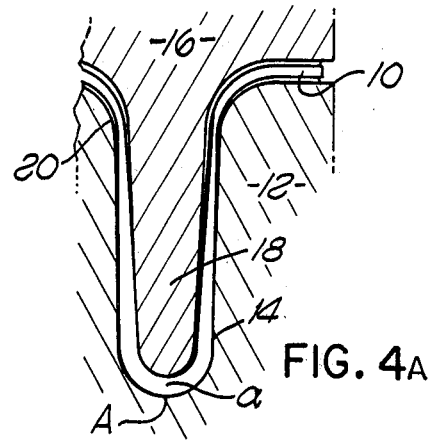
FIGS. 4A, 4B, and 4C illustrate the method of forming an air bubble free seal utilizing the gasket of FIG. 2 in the space between the first and second halves of the housing shown in FIG. 3.
Figure 4B:
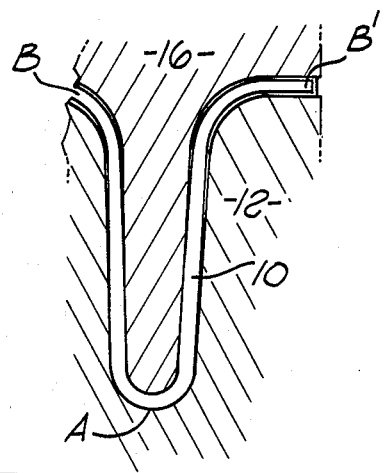
Figure 4C:
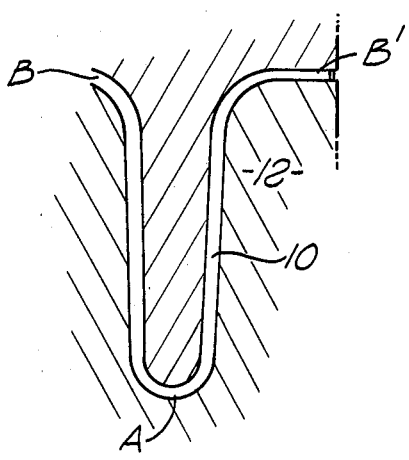

Referring now to FIG. 4A, to form the electrically insulative seal, a layer of dielectric grease 20 is first applied to the sealing surfaces of the gasket, the front housing 16 and the rear housing 12. The tongue 18 of the front housing 16 is then inserted into the groove 14 of the rear housing 12 with the gasket between the front housing 16 and the rear housing 12. When the tongue 18 is inserted into the groove 14, the first point of contact is at the apex of the gasket, point a, which is positioned at point A between the apex of the tongue 18 and the bottom of the groove 14. The front housing 16 and the rear housing 12 are then pressed together, causing a bulge to form in the gasket as the gasket is deformed by the compression force. The geometry of the gasket previously described and the relative geometry of the front housing 16 and the rear housing 12 causes the bulge to initially form at the bottom A of the groove 14 and thereafter continuously move upwardly toward the edge points B and B' (FIG. 4B). The bulge in the gasket displaces the grease and all the air bubbles between the surfaces to be sealed by progressively squeezing both the grease and the air entrapments out toward the ends B and B'. In the final compression stage, a pressure gradient exists along the gasket interface with the enclosure which lets grease and air escape from the ends B and B' to form a completely grease filled, bubble free seal (FIG. 4C).

In order to facilitate formation of a bubble free seal, the angle 24 between the tongue 18 of the front housing and the groove 14 of the rear housing 12 is slightly larger than the angle 34 between the opposing surfaces of the gasket 10. Thus, while it is preferred that the angle 24 be slightly larger than the angle 34, such an angle relationship is not absolutely necessary so long as the thickness d of the gasket 10 decreases from point a to points b and b' while the space D between the front housing 16 and the rear housing 12, increases from point A to points B and B'.

Although various materials may be utilized in accordance with the present invention, it is preferred that the gasket be made of a non-conductive silicone compound such as dimethylsilicone and the grease be a dielectric grease which is non-reactive with the gasket. For example, a dimethylsilicone gasket may be used with fluorosilicone grease.

It will be appreciated, of course, that the front and rear housing portions 16 and 12, respectively are also made of a non-conductive material and may, for example, be a polycarbonate or acrylonitrile-butadiene-styrene (ABS) material having a thickness of about 0.25 inches.

Figures 5, 6, 7:
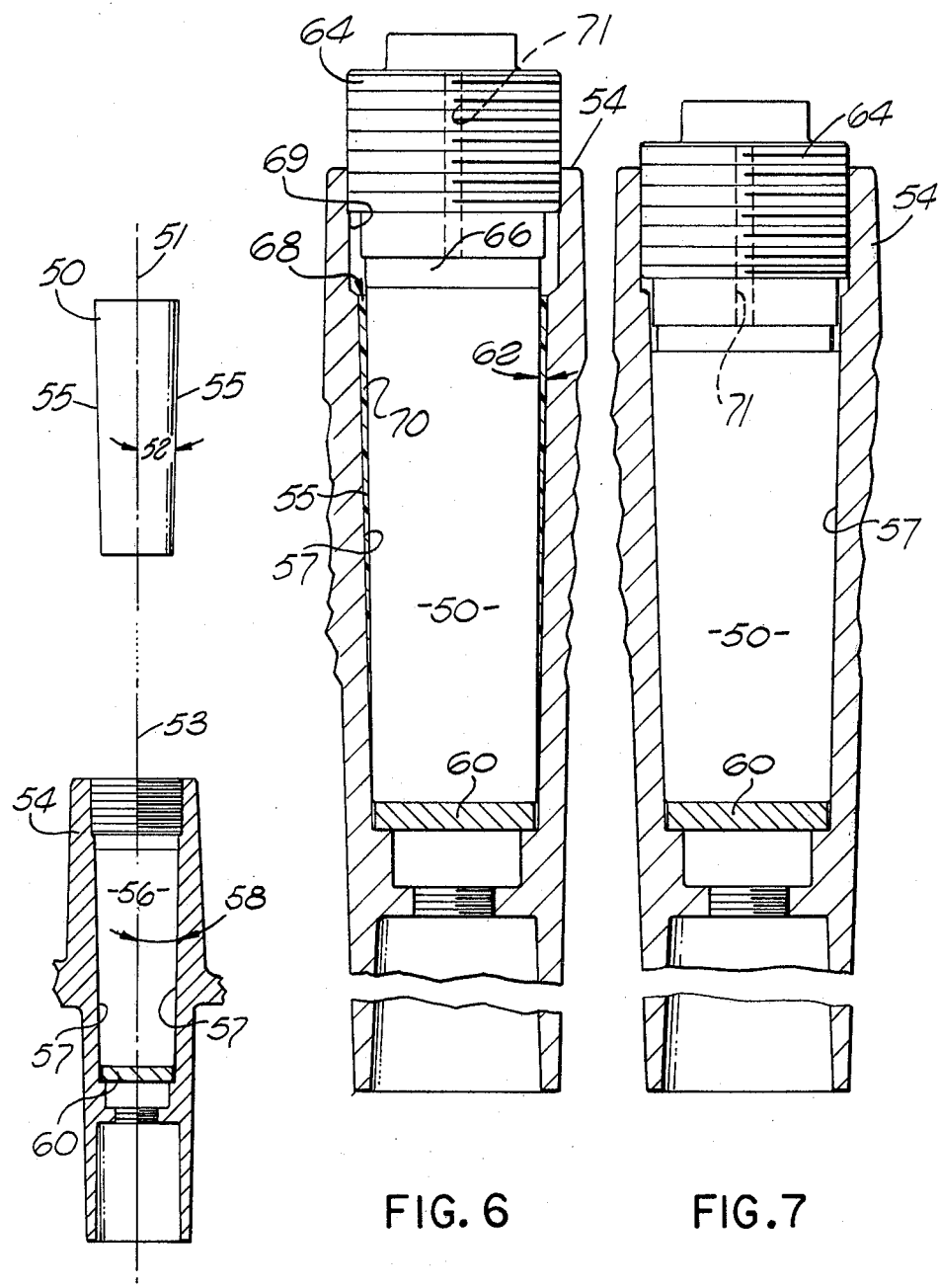
FIG. 5 is a cross sectional side view of an access port through a housing and a plug adapted to be inserted into the port.
FIG. 6 shows the plug of FIG. 5 in an uncompressed state in the access port.
FIG. 7 shows the electrically insulative seal apparatus of FIG. 5 with the plug inserted in the access opening in the compressed state.

Referring now to FIGS. 5, 6 and 7, a second embodiment of the present invention is illustrated whereby an access port 56 between the inside and outside of the housing enclosure 54 may be electrically insulated. More specifically, the port 56 is provided with side walls (seal surfaces) 57 which are sloped inwardly toward the center axis 53 of the port 56 at an angle 58. A plug 50 preferably made of the aforementioned silicone compound, also has side walls (seal surfaces) 55 which are sloped inwardly toward the center axis 51 of the plug 50 at an angle 52. The angle 52 of the plug 50 is provided to be smaller than the angle 58 of the access port 56.

An electrically insulating seal is achieved by first placing a washer 60 in a bottom location of the port 56 to provide a support surface for the end of the plug 50. A dielectric grease 70 (FIG. 6), such as fluorosilicone grease, is then placed on the seal surfaces and the plug 50 is inserted into the port 56 so that the bottom of the plug 50 rests on the washer 60. A wedge-shaped annular space 68 (FIG. 6) having an angle 62 will thus be formed between the surface 55 of the plug 50 and the surface 57 of the port 56.

A compression washer 66 is next placed on top of the plug 50.

A compression screw 64 is positioned on top of the compression washer 66 to be screwed into an inside thread 69 in the top of the port 56.

In a manner similar to that previously described, as the plug is pressed into the port a bulge is formed which presses against the lower portion of the surface 57. As the compression screw 64 is screwed down, pressure is exerted against the top of the plug 50. Thereafter, as the pressure increases the bulge travels upward pressing against the surface 57 thereby squeezing the grease and air upward until the excess grease and all the air bubbles have been expelled via the vent slot 71 (FIG. 7). Thus, in the final compressed state, a pressure gradient exists along the plug interface with the housing 54 to finally form a completely grease-filled, bubble-free seal.

It will be appreciated of course, that the grease may be eliminated if a sufficiently flexible gasket or plug is used so that air will be expelled upon the application of a compression force.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

What is claimed is:

1. An electrical insulating static seal assembly comprising:
    a first member having a first seal surface;
    a second member having a second seal surface;
    a deformable gasket positioned between the first and second seal surfaces for being pressed between the first and second seal surfaces, to provide a sealed region between the first and second members, the distance between the first and second seal surfaces being minimum at a central location of the sealed region and continuously increasing toward the edge of the sealed region, the gasket having a thickness, prior to compression, which is maximum at the central location and continuously decreasing toward the edge of the gasket; and
    means for pressing and holding the first and second seal surfaces together.

2. The assembly of claim 1 further comprising a dielectric compound disposed between the gasket and the sealing surfaces for capturing and extruding gas bubbles from between the sealing surfaces as the force from the pressing means increases.

3. The assembly of claim 2 wherein the dielectric compound is a silicone compound and the gasket is a silicone compound.

4. The assembly of claim 3 wherein the dielectric compound is fluorosilicone grease and the gasket is dimethylsilicone.

5. An electrically insulating static seal assembly comprising:
    a first member having a concave first seal surface;
    a second member having a convex second seal surface, the second member being insertable within the first member whereby the first and second seal surfaces are juxtaposed for being pressed toward each other, the first seal surface and the second seal surface defining a space therebetween of increasing width extending from an interior seal location to an edge seal location when the first and second members are juxtaposed prior to being pressed together;
    sealing means comprising a deformable gasket positioned for filling the space when the first and second members are pressed together; and
    means for pressing the first member and the second member together.

6. The assembly of claim 5 wherein the sealing means further comprises a dielectric compound disposed between the seal surfaces.

7. The assembly of claim 6 wherein the dielectric compound is a silicone compound and the first member is a silicone compound.

8. The assembly of claim 7 wherein the dielectric compound is fluorosilicone grease and the first member is dimethylsilicone.

9. An electrical insulating static seal assembly comprising:
    a first member having a U-shaped tongue portion with a first seal surface on one side of the tongue and a second seal surface on the other side of the tongue, the first and second seal surfaces of the tongue forming a first angle closing toward the apex of the tongue;
    a second member having a U-shaped channel for receiving the U-shaped tongue, the U-shaped channel having a third seal surface on one side of the channel and a fourth seal surface on the other side of the channel, the third and fourth seal surfaces forming a second angle closing toward the bottom of the channel, the first angle being smaller than the second angle;
    a deformable gasket having a shape for being positioned in the channel between the tongue and the channel, the gasket having a location of maximum undeformed thickness positioned between the apex of the tongue and the bottom of the channel and a minimum undeformed thickness at its edges remote from the location of maximum undeformed thickness; and
    means for pressing the first and second members together with the tongue positioned in the channel.

10. The assembly of claim 9 further comprising a sealing compound disposed on the seal surfaces.

11. The assembly of claim 10 wherein the sealing compound is a silicone compound and the gasket is a silicone compound.

12. The assembly of claim 11 wherein the sealing compound is fluorosilicone grease and the gasket is dimethylsilicone.

13. An electrically insulating static seal assembly comprising:
   a first member having an access port therein with side walls inwardly sloped toward the center axis of the access port for defining a first angle between the first member side walls and the center axis of the port;
   a deformable second member having a shape substantially similar of the access port for being inserted into the access port, the second member having side wall portions inwardly sloped toward the center axis of the second member for defining a second angle between the second member side wall portions and the center axis of the deformable second member, the first angle being larger than the second angle when the second member is in an non-compressed state;
   compression means for pressing the second member into the access port of the first member; and
   a sealing compound disposed between the first and second member side walls for capturing and progressively extruding the gas bubbles from between the first and second member sidewalls as the pressing force of the compression means increases.

14. A method of forming an electrically insulating static seal between a first member and a second member comprising the steps of:
   a. providing a first seal surface on the first member;
   b. providing a second seal surface on the second member, the distance between the first and second seal surfaces when the seal surfaces are juxtaposed being minimum at an interior seal surface location and continuously increasing toward at least one edge seal surface location remote from the interior seal location;
   c. providing a deformable gasket between the first and second seal surfaces having a maximum undeformed thickness at a central gasket location, the thickness decreasing toward the edge of the gasket;
   d. disposing a sealing compound between the gasket surfaces and the seal surfaces;
   e. positioning the gasket between the first and second seal surfaces with the maximum gasket thickness adjacent to the region of minimum distance of the interior seal surface location; and
   f. pressing the gasket between the first member and the second member for progressively squeezing the sealing compound along the sealing surface from the interior seal surface location toward the edge seal surface location.

15. A method for forming an electrically insulating static seal in an access port of a housing comprising the steps of:
   a. providing access port side walls sloped inwardly toward the housing interior of the port at a first angle;
   b. providing a deformable plug having an undeformed shape substantially similar to the shape of the access port and having side walls inwardly sloped toward an apex end of the plug second angle, the second angle being smaller than the first angle;
   c. applying sealing compound to the region between the walls of the plug and the walls of the access port;
   d. inserting the plug into the access port apex end first; and
   e. applying a compression force to the end of the plug opposite the apex end for deforming the plug outwardly for progressively squeezing the sealing compound along the region between the walls of the opening and the walls of the plug from the apex end of the plug to the edge of the plug remote from the apex end.

* * * * *